(12) United States Patent
Ohashi et al.

(10) Patent No.: US 9,980,384 B2
(45) Date of Patent: May 22, 2018

(54) CIRCUIT BOARD AND ELECTRONIC APPARATUS INCLUDING THE SAME

(71) Applicant: KYOCERA Corporation, Kyoto-shi, Kyoto (JP)

(72) Inventors: Yoshio Ohashi, Satsumasendai (JP); Kunihide Shikata, Kirishima (JP)

(73) Assignee: KYOCERA Corporation, Kyoto (JP)

( * ) Notice: Subject to any disclaimer, the term of this patent is extended or adjusted under 35 U.S.C. 154(b) by 0 days. days.

(21) Appl. No.: 14/407,405

(22) PCT Filed: Jun. 21, 2013

(86) PCT No.: PCT/JP2013/067140
§ 371 (c)(1),
(2) Date: Dec. 11, 2014

(87) PCT Pub. No.: WO2013/191288
PCT Pub. Date: Dec. 27, 2013

(65) Prior Publication Data
US 2015/0144385 A1 May 28, 2015

(30) Foreign Application Priority Data
Jun. 21, 2012 (JP) .................................. 2012-140165

(51) Int. Cl.
*H05K 1/03* (2006.01)
*H05K 1/09* (2006.01)
(Continued)

(52) U.S. Cl.
CPC ........... *H05K 1/181* (2013.01); *C04B 37/025* (2013.01); *H05K 1/0306* (2013.01); *H05K 1/092* (2013.01);
(Continued)

(58) Field of Classification Search
CPC ........ H05K 1/092; H05K 1/181; H05K 3/388; H05K 1/0306; H05K 2201/2063;
(Continued)

(56) References Cited

U.S. PATENT DOCUMENTS 4,712,161 A * 12/1987 Pryor ..................... H01C 17/07
174/256
5,277,724 A * 1/1994 Prabhu ................ C03C 10/0054
156/320
(Continued)

FOREIGN PATENT DOCUMENTS

| JP | S56-026784 A | 3/1981 |
|---|---|---|
| JP | 64-044054 A | 2/1989 |
| JP | 2008-226771 A | 9/2008 |

OTHER PUBLICATIONS

International Search Report (Form PCT/ISA/210) dated Sep. 17, 2013 issued for PCT/JP2013/067140.
(Continued)

*Primary Examiner* — Ishwarbhai B Patel
(74) *Attorney, Agent, or Firm* — Procopio Cory Hargreaves and Savitch LLP

(57) ABSTRACT

The circuit board includes a ceramic sintered body and a metal wiring layer provided on at least one primary surface thereof with a glass layer interposed therebetween, and when the cross section of the circuit board perpendicular to the primary surface of the ceramic sintered body is viewed, the ratio of the length of an interface between the glass layer and the metal wiring layer to a length of the glass layer in a direction along the primary surface is 1.25 to 1.80.

5 Claims, 2 Drawing Sheets

(51) Int. Cl.
  *H05K 1/18* (2006.01)
  *H05K 3/38* (2006.01)
  *C04B 37/02* (2006.01)
  *H05K 1/11* (2006.01)

(52) U.S. Cl.
  CPC .......... *H05K 3/388* (2013.01); *C04B 2237/10* (2013.01); *C04B 2237/343* (2013.01); *C04B 2237/407* (2013.01); *C04B 2237/55* (2013.01); *C04B 2237/59* (2013.01); *C04B 2237/86* (2013.01); *H01L 2224/48091* (2013.01); *H01L 2224/73265* (2013.01); *H05K 1/111* (2013.01); *H05K 2201/10462* (2013.01); *H05K 2201/2063* (2013.01); *Y02P 70/611* (2015.11)

(58) Field of Classification Search
  CPC .. H05K 1/0284; H05K 1/0296; H05K 1/0298; H05K 1/03; H05K 1/097; H05K 1/0213; H05K 1/0216; H05K 1/0218; H05K 1/0219; H05K 1/0224; H05K 1/0227; H05K 1/0228; H05K 1/0236; H05K 1/0237; H05K 1/0239; H05K 1/024; H05K 1/0242; H05K 1/0245; H05K 1/0246; H05K 1/0248; H05K 1/025; H05K 1/0253; H05K 1/0256; H05K 1/0257; H05K 1/0259; H05K 1/026; H05K 1/0263; H05K 1/0265; H05K 1/0278; H05K 1/036; H05K 1/0366; H05K 1/0373; H05K 1/0393; H05K 1/05; H05K 1/11; H05K 1/111; H05K 1/021; H05K 1/0212; H05K 1/0215; H05K 1/023; H05K 1/0231; H05K 1/0233; H05K 1/0234; H05K 1/0243; H05K 1/0295; H05K 1/14; H05K 1/141; H05K 1/142; H05K 1/144; H05K 1/145; H05K 1/162; H05K 1/165; H05K 1/16; H05K 1/182; H05K 1/183; H05K 1/184; H05K 1/185; H05K 2201/0317; H05K 2201/041; H05K 2201/049; H05K 2201/09763; H05K 2201/09872; H05K 2201/10446; H05K 2201/10454; H05K 2201/10462; H05K 2201/10469; H05K 2201/10477; Y02P 70/611; C04B 37/025; C04B 2237/86; C04B 2237/407; C04B 2237/59; C04B 2237/55; C04B 2237/343; C04B 2237/10; H01L 2224/48091; H01L 2224/73265; H01L 2237/343; H01L 2237/10
  USPC .................. 174/250–268; 428/210; 361/760, 361/792–795
  See application file for complete search history.

(56) References Cited

U.S. PATENT DOCUMENTS

| | | | | |
|---|---|---|---|---|
| 5,730,543 | A * | 3/1998 | Schonauer | C04B 37/023 403/179 |
| 5,855,711 | A * | 1/1999 | Araki | C04B 35/111 156/277 |
| 6,110,596 | A * | 8/2000 | Kasori | C03C 8/24 428/216 |
| 6,811,635 | B2 * | 11/2004 | Sakamoto | B32B 18/00 156/89.12 |
| 6,815,073 | B2 * | 11/2004 | Tanei | H01L 21/4867 257/E23.075 |
| 7,332,231 | B2 * | 2/2008 | Ichiyanagi | H01G 4/228 257/E23.077 |
| 2002/0197488 | A1 * | 12/2002 | Tanei | H01L 21/4867 428/432 |
| 2005/0266251 | A1 * | 12/2005 | Rita | B32B 15/04 428/432 |
| 2009/0050901 | A1 * | 2/2009 | Gadkaree | H01L 21/2007 257/77 |

OTHER PUBLICATIONS

Extended European Search Report dated Dec. 18, 2015 issued by the European Patent Office for Counterpart European Application No. EP 13807421.6.
6001 Chemical Abstracts. XP 000186292, ISSN: 0009-2258. 95 Aug. 24, 1981, No. 8, Columbus, OH, US.

* cited by examiner

CIRCUIT BOARD AND ELECTRONIC APPARATUS INCLUDING THE SAME

TECHNICAL FIELD

The present invention relates to a circuit board and an electronic apparatus including the circuit board and at least one electronic component mounted thereon.

BACKGROUND ART

A circuit board used to mount various types of electronic components, such as a semiconductor element, a heater element, and a Peltier element, includes a ceramic sintered body and a metal wiring layer provided on at least one primary surface thereof, and an electronic apparatus including this circuit board and at least one electronic component mounted on the metal wiring layer thereof with an electrode pad or the like interposed therebetween has been used for various types of instruments.

In addition, the circuit board as described above is required so that the metal wiring layer is not likely to be peeled away from the ceramic sintered body due to heat generated during operation of the electronic component to be mounted. Hence, in order to improve the adhesion strength between the ceramic sintered body and the metal wiring layer, a glass is contained in a paste which forms the metal wiring layer provided on at least one primary surface of the ceramic sintered body, and the metal wiring layer is provided thereon with a glass layer interposed therebetween.

For example, PTL 1 has proposed a copper conductive paste formed from at least a conductive powder containing a copper powder as a primary component, a glass frit, and an organic vehicle. In this copper conductive paste, the glass frit contains at least a borosilicate zinc glass frit which has a softening point is 700° C. or less and a contact angle of 60° or less to a film formed from a copper powder, the surface of which is not substantially oxidized, in a nitrogen atmosphere at 900° C.; and a borosilicate glass frit which has a softening point of 700° C. or less and a solubility of 1 mg/cm$^2$·hr or less to an aqueous sulfuric acid solution having a concentration of 10 percent by mass at 25° C.

CITATION LIST

Patent Literature

PTL 1: Japanese Unexamined Patent Application Publication No. 2008-226771

SUMMARY OF INVENTION

Technical Problem

In recent years, because of an increase in degree of integration of electronic components and reduction in size and thickness of electronic apparatuses, the quantity of heat applied to a circuit board per unit volume during operation of an electronic component has been increased. Hence, a highly reliable circuit board which can be used for a long period of time is required. That is, in particular, besides having good heat dissipation characteristics, the circuit board described above is required so that a metal wiring layer is not likely to be peeled away from a ceramic sintered body due to operation of an electronic component and/or cooling/heating cycles performed by repeated on-off operations thereof.

The present invention was devised to satisfy the requirements described above and provides a highly reliable circuit board which can be used for a long period of time and an electronic apparatus including this circuit board and at least one electronic component mounted thereon.

Solution to Problem

The circuit board of the present invention comprises a ceramic sintered body and a metal wiring layer provided on at least one primary surface thereof with a glass layer interposed therebetween, and when the cross section of the circuit board perpendicular to the primary surface of the ceramic sintered body is viewed, the ratio of the interface length between the glass layer and the metal wiring layer to the length of the glass layer in a direction along the primary surface is 1.25 to 1.80.

In addition, the electronic apparatus of the present invention comprises the circuit board of the present invention having the above structure and an electronic component mounted thereon.

Advantageous Effects of Invention

The circuit board of the present invention has good heat dissipation characteristics, and the metal wiring layer is not likely to be peeled away from the ceramic sintered body due to the operation of an electronic component and/or cooling/heating cycles performed by repeated on-off operations thereof; hence, a highly reliable circuit board which can be used for a long period of time can be obtained.

In addition, according to the electronic apparatus of the present invention, since the electronic component is mounted on the highly reliable circuit board having the above structure, a highly reliable electronic apparatus which can be used for a long period of time can be obtained.

DESCRIPTION OF EMBODIMENTS

Hereinafter, one example of this embodiment will be described with reference to the drawings. FIG. 1 shows one example of an electronic apparatus including a circuit board of this embodiment, (a) is a cross-sectional view, and (b) is an enlarged view of an S portion shown in (a).

Figure 1A:
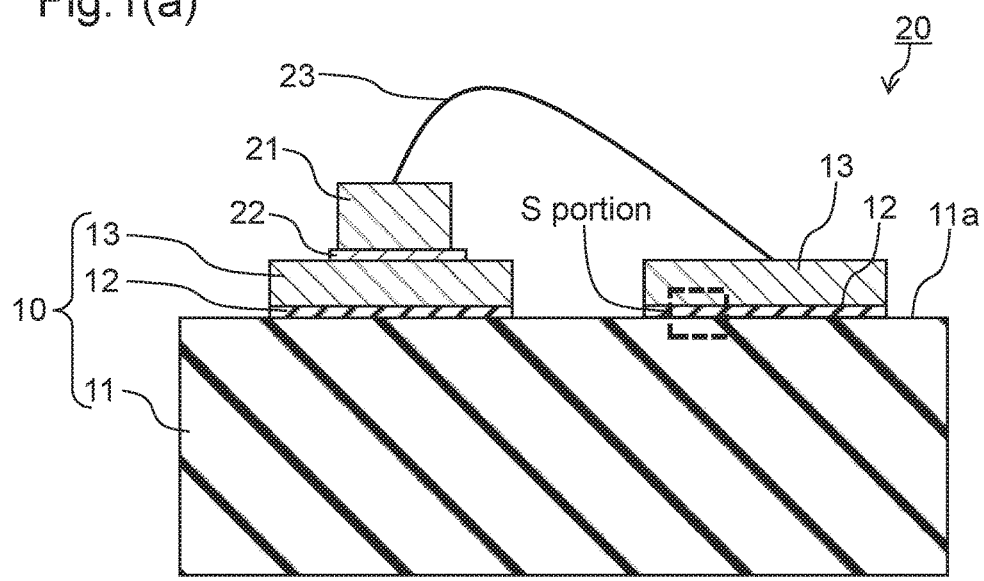
FIG. 1 shows one example of an electronic apparatus including a circuit board of this embodiment, (a) is a cross-sectional view, and (b) is an enlarged view of an S portion shown in (a).

As shown in FIG. 1(a), a circuit board 10 of this embodiment includes a ceramic sintered body 11 and metal wiring layers 13 provided on at least one primary surface 11a thereof with glass layers 12 interposed therebetween, and an electronic apparatus 20 of this embodiment includes the circuit board 10 and an electronic component 21 mounted thereon. In addition, in the electronic apparatus 20 in FIG. 1(a), the electronic component 21 is shown by way of example which is mounted on one of the metal wiring layers 13 on the one primary surface 11a of the ceramic sintered body 11 of the circuit board 10 with an electrode pad 22 interposed therebetween. In addition, in FIG. 1(a), the electronic component 21 which is electrically connected to the adjacent metal wiring layer 13 by a bonding wire 23 is shown by way of example.

Figure 1B:
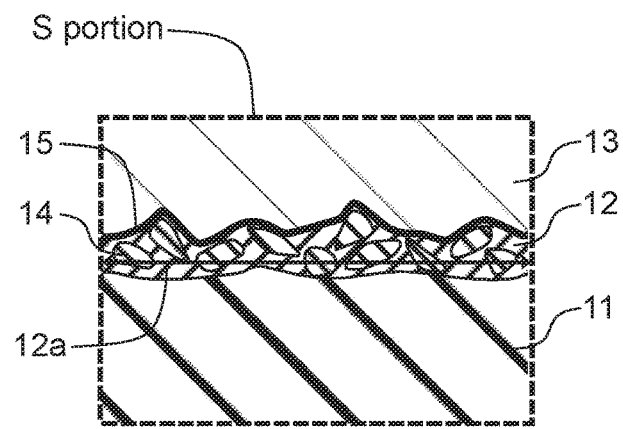

In addition, as shown in FIG. 1(b) which is an enlarged view of the S portion in FIG. 1(a), when a cross section of the circuit board 10 of this embodiment in a thickness direction of the ceramic sintered body 11 is viewed, that is, when a cross section perpendicular to the primary surface 11a is viewed, the ratio of the length of an interface 15 between the glass layer 12 and the metal wiring layer 13 (hereinafter abbreviated as the "length of the interface 15" in some cases) to a length 12a of the glass layer 12 in a direction along the primary surface 11a (hereinafter abbreviated as the "length 12a" in some cases) is 1.25 to 1.80. As described above, since the ratio of the length of the interface 15 is 1.25 or more, the contact area between the glass layer 12 and the metal wiring layer 13 is increased, and hence, a high adhesion strength can be obtained.

In addition, as the above ratio is increased, the length of the interface 15 is increased, and the contact area is increased; however, the increase of the length of the interface 15 indicates an increase in undulation, and in this highly undulated state, the adhesion strength may be decreased in some cases due to an increase in number of origins of cracks, and/or the heat dissipation characteristics may be degraded in some cases since the size of metal particles forming the metal wiring layer 13 is excessively decreased. Accordingly, the upper limit of this ratio is set to 1.80 or less. In addition, the length 12a of the glass layer 12 may be the whole length of the glass layer 12 or a part thereof as long as the region of the length to be measured coincides with the region of an interface length 15a.

Since the circuit board 10 of this embodiment satisfies the above configuration, the heat dissipation characteristics are good, and peeling of the metal wiring layer 13 from the ceramic sintered body 11 due to the operation of the electronic component or cooling/heating cycles performed by repeated on-off operations thereof can be suppressed. Accordingly, a highly reliable circuit board which can be used for a long period of time can be obtained.

Next, a method for calculating the ratio of the length of the interface 15 to the length 12a will be described. First, the circuit board 10 including the ceramic sintered body 11 and the metal wiring layer 13 provided on the primary surface 11a thereof with the glass layer 12 interposed therebetween is cut in a thickness direction of the ceramic sintered body 11, followed by performing polishing by a cross section polisher (CP), and the cross section thus polished is used as a measuring surface.

Next, the cross section thus obtained is observed at a magnification of 3,000 times using a SEM (scanning electron microscope). In this case, the observation region is, for example, 43 μm in width and 28 μm in length. Incidentally, FIG. 1(b) conceptually shows this observation region, and the observation is performed so that the interface 15 is placed in a width direction. In addition, based on the image in this observation region, analysis is performed using an image analysis software (such as ImageJ), and the length of the interface 15 between the glass layer 12 and the metal wiring layer 13 in this image is obtained. Next, the length of the interface 15 is divided by the length (43 μm in this region) of the length 12a in this image, so that the ratio in this image is calculated. In addition, the work described above is performed at 5 positions in total by changing the observation region, and the average value obtained therefrom is regarded as the ratio of the length of the interface 15.

In addition, in the circuit board 10 of this embodiment, crystal particles 14 having a circle equivalent diameter of 0.4 to 2.0 μm are preferably present in the glass layer 12, and in the glass layer 12, the presence rate of the crystal particles 14 with respect to the length 12a is preferably 0.5 to 0.9 pieces/μm.

When the configuration as described above is satisfied, without degrading the heat dissipation characteristics, metal particles contained in the metal wiring layer 13 enter between undulations of the glass layer 12 generated by the presence of the crystal particles 14 and the presence rate thereof, and hence, the adhesion strength can be further increased.

In the case described above, the crystal particles 14 present in the glass layer 12 are preferably crystal particles 14 having a spinel structure, such as zinc aluminate ($ZnAl_2O_4$), magnesium aluminate ($MgAl_2O_4$), manganese aluminate ($MnAl_2O_4$), and iron aluminate ($FeAl_2O_4$). When having a spinel structure, the crystal particles 14 have projections, and hence, the undulations are likely to be generated along the interface 15. Hence, the metal particles of the metal wiring layer 13 enter between the undulations thus formed, and as a result, the adhesion strength can be increased.

In addition, among the crystal particles 14 having a spinel structure mentioned above, zinc aluminate is preferably used. The reason for this is that the projection of zinc aluminate is large as compared to that among the aforementioned crystal particles 14 having a spinel structure. In addition, the reason for this is also that since zinc aluminate has a high electric resistance, even when the metal wiring layers 13 are disposed in parallel with a small gap therebetween, short circuit is not likely to occur, and the reliability of the circuit board 10 is not likely to be degraded.

In addition, for example, the presence of the crystal particles 14 may be observed at a magnification of 3,000 times using a SEM as is the calculation of the ratio of the length of the interface 15 to the length 12a, and the presence rate of the crystal particles 14 may be obtained in such a way that the number of the crystal particles 14 having a circle equivalent diameter of 0.4 to 2.0 μm is calculated using an image analysis software (such as ImageJ) and is then divided by the length of the length 12a. Incidentally, for the calculation of this presence rate, the observation may be performed at 5 positions in total by changing the observation region, and the average value obtained therefrom is regarded as the presence rate. In addition, the identification of the crystal particles 14 may be performed using an EDS (energy dispersive X-ray analyzer) attached to a SEM or a TEM (transmission electron microscope) or may be confirmed by an electron diffraction method using a TEM.

In addition, in the circuit board 10 of this embodiment, alumina particles are preferably present in the metal wiring layer 13, and in a presence region in which the alumina particles are present, at least one component which is the same as one of components forming the glass layer 12 is preferably present. The reason for this is based on the following finding. When a metal paste containing a glass component is formed into the metal wiring layer 13 by sintering, if the glass component is pushed out by the metal particles and is exposed to the surface of the metal wiring layer 13, plating adhesion is degraded; however, it was observed that by addition of alumina particles to the metal paste, the plating adhesion can be suppressed from being degraded. In addition, from this observation, it was found that the same component as that forming the glass layer 12 is present in the presence region of the alumina particles.

In this case, whether at least one component which is the same as one of the constituent components of the glass layer 12 is present or not in the presence region of the alumina particles can be confirmed by the following method. First, by the use of an EDS attached to a SEM, the constituent elements of the glass layer 12 on the cross section thereof are confirmed. Next, the cross section of the metal wiring layer 13 is observed at a magnification of 10,000 times using a SEM or a TEM. The observation region in this case is, for example, 6 μm in width and 7 μm in length. In addition, by a mapping obtained from this observation region using the attached EDS, it may be confirmed whether the same component (such as silicon (Si)) as one of the constituent components of the glass layer 12, which are confirmed in advance, is present or not at a presence position (position at which the mapping of aluminum and that of oxygen are overlapped with each other) of the alumina particle.

In addition, in the circuit board 10 of this embodiment, zirconia particles are preferably present in the glass layer 12. If the configuration as described above is satisfied, when the metal wiring layer 13 is etched or is processed by a plating treatment, corrosion of the glass layer 12 caused by an etching solution or a plating solution can be suppressed by a high chemical resistance of zirconia particles, and as a result, a high adhesion strength can be maintained.

In addition, the presence of zirconia particles in the glass layer 12 can be confirmed by the following method. First, the cross section of the glass layer 12 is observed at a magnification of 10,000 times using a SEM or a TEM. Next, the presence of zirconia particles may be confirmed in this observation region using an attached EDS. Alternatively, the presence of zirconia particles may also be confirmed by an electron diffraction method using a TEM.

In addition, in the circuit board 10 of this embodiment, the ceramic sintered body 11 is preferably formed of an aluminum oxide sintered body, and zirconia particles are preferably present on the surface of this aluminum oxide sintered body. When the configuration as described above is satisfied, in the case in which an LED is mounted as an electronic component on the circuit board 10, the reflectance of the ceramic sintered body 11 can be improved. Incidentally, zirconia particles may be present only on the surface of the aluminum oxide sintered body and is not required to be present therein; however, when zirconia particles are present in the aluminum oxide sintered body, the mechanical strength can be improved.

In addition, as for the presence of zirconia particles on the surface of the aluminum oxide sintered body, for example, the surface of the ceramic sintered body 11 may be confirmed using an EDS attached to a SEM. Since the surface of the ceramic 11 also functions as the interface with the glass layer 12 of the circuit board 10, at the cross section at which this interface can be confirmed, the presence of zirconia may also be confirmed using an EDS attached to a SEM.

Hereinafter, one example of a method for manufacturing the circuit board 10 of this embodiment will be described.

As the ceramic sintered body 11 forming the circuit board 10 of this embodiment, although an aluminum oxide sintered body, a zirconium oxide sintered body, a composite sintered body of aluminum oxide and zirconium oxide, a silicon nitride sintered body, an aluminum nitride sintered body, a silicon carbide sintered body, or a mullite sintered body may be used, since an aluminum oxide sintered body has good mechanical strengths besides relatively easy processability, the manufacturing method thereof will be described.

First, by the use of an aluminum oxide ($Al_2O_3$) powder and at least one of powders of silicon oxide ($SiO_2$), magnesium oxide (MgO), calcium oxide (CaO), and the like, each functioning as an auxiliary agent, the ceramic sintered body 11, which is an aluminum oxide sintered body, is formed by a known method. In order to enable zirconia particles to be present on the surface of the aluminum oxide sintered body, blast processing may be performed using a zirconium oxide powder as a polishing agent after the aluminum oxide sintered body is formed, or during the formation of the aluminum oxide sintered body, a zirconium oxide powder may be added. In this case, the addition amount of the zirconium oxide powder is, for example, 5 to 15 parts by mass with respect to 100 parts by mass of the aluminum oxide powder.

Next, for example, by the use of an $R_2O$—$B_2O_3$—$SiO_2$-based (R: alkaline metal element), a $SiO_2$—$Bi_2O_3$—$B_2O_3$-based, or an $R_2O$—$SiO_2$—$B_2O_3$—$Bi_2O_3$-based glass powder, a heat treatment is performed, so that the glass layer 12 is formed on the primary surface 11a of the ceramic sintered body 11.

In order to enable zirconia particles to be present in the glass layer 12, a zirconium oxide powder may be added to the glass powder. In this case, the addition amount of the zirconium oxide powder is, for example, 2 to 12 parts by mass with respect to 100 parts by mass of the glass powder. The size of the zirconium oxide powder is, for example, 0.05 to 1.0 μm.

Subsequently, by performing processing, such as blast processing, on the surface of the glass layer 12 to be used as the interface 15 between the glass layer 12 and the metal wiring layer 13, in the circuit board 10 of this embodiment, the interface 15 between the glass layer 12 and the metal wiring layer 13 can be formed to have specific surface characteristics.

Next, after a metal powder containing copper or silver as a primary component and an organic vehicle are prepared, a metal paste is formed therefrom, and by a known screen printing method, the metal paste is printed on the surface of the glass layer 12 formed on the primary surface 11a of the ceramic sintered body 11. After drying is performed, firing is performed in a non-oxidizing atmosphere, so that the circuit board 10 of this embodiment can be obtained. In addition, as the metal powder used to form the metal wiring layer 13, since having a high heat conductivity and capable of improving the heat dissipation characteristics, copper is preferably used. Alternatively, a metal powder containing copper as a primary component and at least one of zirconium, titanium, molybdenum, and tin as an auxiliary component may also be used. In this case, the primary component indicates a component in an amount of more than 50 percent by mass of 100 percent by mass of all the components forming the metal wiring layer 13.

In addition, as the metal powder, for example, there may be used a metal powder obtained in such a way that a first metal powder having an average particle diameter of 1.0 to 3.5 μm and a second metal powder having an average particle diameter smaller than that of the first metal powder are prepared and then mixed together. In particular, a metal powder obtained by mixing 65 to 95 percent by mass of the first metal powder and 5 to 35 percent by mass of the second metal powder is preferably used.

In this case, the average particle diameter of the second metal powder is preferably 30% to 50% of the average particle diameter of the first metal powder. By the use of the metal powder as described above, the second metal powder having an average particle diameter smaller than that of the first metal powder enters between particles of the first metal powder having a high mass ratio and a large average particle diameter, and as a result, sintering characteristics of the metal paste can be improved.

In addition, the organic vehicle is formed by dissolving an organic binder in an organic solvent, and for example, the ratio of the organic solvent is 2 to 6 with respect to 1 of the organic binder. In addition, as the organic binder, for example, acrylics, such as a poly(butyl methacrylate) and a poly(methyl methacrylate); celluloses, such as a nitro cellulose, an ethyl cellulose, a cellulose acetate, and a butyl cellulose; polyethers, such as a poly(oxymethylene); and polyvinyls, such as polybutadiene and polyisoprene, may be used alone, or at least two types thereof may be used by mixing.

In addition, as the organic solvent, for example, Carbitol, Carbitol acetate, terpineol, metacresol, dimethylimidazole, dimethylimidazolidinone, dimethylformamide, diacetone alcohol, triethylene glycol, paraxylene, ethyl lactate, and isophorone may be used alone, or at least two types thereof may be used by mixing.

Next, another example of the method for manufacturing the circuit board 10 of this embodiment will be described.

First, by a formation method similar to that described above, an aluminum oxide sintered body is prepared. Next, in order to form a metal paste, a metal powder containing copper or silver as a primary component, a glass powder, an inorganic powder to be formed into the crystal particles 14 present in the glass layer 12, and an organic vehicle are prepared. In addition, as a mixing ratio among the metal powder, the glass powder, and the organic vehicle, which form the metal paste, for example, of 100 percent by mass of the metal paste, the content of the metal power is set in a range of 77.0 to 87.0 percent by mass, the content of the glass powder is set in a range of 0.5 to 5 percent by mass, and the content of the organic vehicle is set in a range of 10 to 20 percent by mass. In addition, with respect to 100 parts by mass of the glass powder, 15 to 40 parts by mass of the inorganic powder is preferably added.

When the glass powder is contained in the metal paste as described above, the softening point of the glass powder to be used is preferably 500° C. to 700° C. and more preferably 600° C. to 700° C. In addition, when the above metal powders having different average particle diameters are used, the average particle diameter of the glass powder is preferably 8% to 60% with respect to the average particle diameter of the first metal powder. When the softening point of the glass powder is 600° C. to 700° C., and the average particle diameter thereof is 8% to 60% with respect to the average particle diameter of the first metal powder, the glass powder contained in the metal paste is likely to be softened during firing and is likely to move toward a ceramic sintered body 11 side, so that the glass layer 12 is likely to be formed on the primary surface 11a of the ceramic sintered body 11.

In addition, in order to enable alumina particles to be present in the metal wiring layer 13, when the metal paste is formed, an aluminum oxide powder may be added. In this case, the addition amount of the aluminum oxide powder is, for example, 0.05 to 0.5 parts by mass with respect to 100 parts by mass of the metal powder. The size of the aluminum oxide powder is, for example, 0.05 to 1 μm.

In addition, as the inorganic powder, a powder is preferably used which is obtained in such a way that after an aluminum oxide powder mixed with a zinc oxide powder is processed by a calcination treatment in advance to form zinc aluminate, pulverization thereof is performed. The reasons for this are not only that zinc aluminate has a spinel structure, but also that a shape having a larger number of projections can be formed by calcination and pulverization. In addition, as particular calcination conditions using the powder described above, the calcination temperature and the calcination time may be set to 800° C. to 950° C. and 0.5 to 3 hours, respectively. In addition, the average particle diameter obtained after the calcined powder is pulverized is preferably set to 0.4 to 2.0 μm.

In addition, in order to obtain magnesium aluminate, an aluminum oxide powder and a magnesium oxide powder may be used; in order to obtain manganese aluminate, an aluminum oxide powder and a manganese dioxide powder may be used; and in order to obtain iron aluminate, an aluminum oxide powder and an iron oxide powder may be used.

In addition, by the use of the metal paste thus obtained, printing is performed on the primary surface 11a of the ceramic sintered body 11 by a known screen printing method, and after drying and degreasing are performed, firing is performed in a non-oxidizing atmosphere. Furthermore, in order to enable the metal wiring layer 13 to have a desired thickness, by the use of a metal paste containing no glass powder nor inorganic powder, printing, drying, and firing may be repeatedly performed, or after the steps of printing and drying are performed a plurality of times, firing may be finally performed once. In addition, since the metal paste printed on the primary surface 11a of the ceramic sintered body 11 is preferably dried in a short time while prevented from being oxidized, the drying temperature is preferably set to 80° C. to 150° C.

In addition, when the metal powder forming the metal paste is copper, firing may be performed at a highest temperature of 900° C. to 1,050° C. for a firing time of 0.5 to 3 hours. Alternatively, when the metal powder forming the metal paste is silver, firing may be performed at a highest temperature of 850° C. to 1,000° C. for a firing time of 0.5 to 3 hours.

In addition, as a method for forming the metal wiring layer 13, the metal wiring layer 13 may be formed in such a way that after a metal layer is formed on the primary surface 11a of the ceramic sintered body 11, a resist film is formed in a necessary region, etching is then performed using, for example, an etching solution of ferric chloride, copper chloride, or an alkali, and subsequently, the resist film is removed by an aqueous sodium hydroxide solution or the like.

In addition, a plating treatment may be performed on the whole surface of the metal wiring layer 13 or a part thereof. By the plating treatment performed as described above, an adhesion treatment of the electrode pad 22, the bonding wire 23, and/or the like can be easily performed, and oxidation corrosion of the metal wiring layer 13 can be suppressed. As the type of plating, any known plating may be used, and for example, gold plating, silver plating, or nickel-gold plating may be mentioned.

In addition, the thickness of the metal wiring layer 13 is preferably 8 to 30 μm. When the thickness of the metal wiring layer 13 is 8 to 30 μm, a necessary conductivity to be used as the circuit board 10 can be not only obtained, but also the gap between the metal wiring layers 13 can be decreased when a plurality of metal wiring layers 13 are formed by etching. Accordingly, since the reduction in pitch between the wiring layers and reduction in size thereof can be achieved, the heat dissipation characteristics can be further improved.

In addition, when the metal paste is filled in a through-hole provided in the ceramic sintered body 11 and is also applied to cover this through-hole, followed by firing, and furthermore, when the metal paste is applied to the other primary surface of the ceramic sintered body 11 and then fired, the heat dissipation characteristics can also be improved.

In addition, instead of having a plate shape, the ceramic sintered body 11 forming the circuit board 10 of this embodiment may be formed by laminating sheets to have a flow path inside. As described above, when the flow path is formed inside the ceramic sintered body 11, if a cooling medium in the form of a gas or a liquid is allowed to flow through the flow path, a circuit board 10 having significantly excellent heat dissipation characteristics can be obtained.

Accordingly, the circuit board 10 of this embodiment obtained by the manufacturing method described above has good heat dissipation characteristics, and in addition, since the metal wiring layer 13 is not likely to be peeled away from the ceramic sintered body 11 due to the operation of the electronic component 21 and/or cooling/heating cycles performed by repeated on-off operations thereof, a highly reliable circuit board 10 which can be used for a long period of time is obtained. In addition, for the formation of the circuit board 10 of this embodiment, when the glass layer 12 and the metal wiring layer 13 are formed by the method described above using a ceramic sintered body 11 provided with dividing grooves, and the ceramic sintered body 11 is then divided, many circuit boards 10 can be efficiently formed. However, the method for manufacturing the circuit board 10 of this embodiment is not limited to the manufacturing methods described above.

Next, as for the electronic apparatus 20 of this embodiment, for example, when the electrode pad 22 is provided on the metal wiring layer 13 forming the circuit board 10 of this embodiment, and the electronic component 21 is mounted on this electrode pad 22, the electronic apparatus 20 of this embodiment can be formed. Since the electronic apparatus 20 of this embodiment includes the circuit board 10 of this embodiment and the electronic component 21 mounted thereon, a highly reliable electronic apparatus 20 which can be used for a long period of time is obtained.

In addition, as the electronic component 21 mounted on the circuit board 10, for example, there may be mentioned a semiconductor element, such as an insulated-gate bipolar transistor (IGBT) element, an intelligent power module (IPM) element, a metal oxide semiconductor field-effect transistor (MOSFET) element, a light emitting diode (LED) element, a freewheeling diode (FWD) element, a giant transistor (GTR) element, or a Schottky barrier diode (SBD); a heater element for a sublimatic thermal printer head or a thermal inkjet printer head; and a Peltier element.

Hereinafter, although examples of the present invention will be described in detail, the present invention is not limited to the following examples.

EXAMPLE 1

Samples were formed which had different ratios of the length of the interface 15 between the glass layer 12 and the metal wiring layer 13 to the length 12a of the glass layer 12, and the adhesion strength and the thermal reliability of each sample were confirmed.

First, by the use of silicon oxide and magnesium oxide each functioning as a sintering auxiliary agent, an aluminum oxide sintered body containing 96 percent by mass of aluminum oxide was formed.

Next, a heat treatment was performed using an $R_2O$—$B_2O_3$—$SiO_2$-based glass powder which had a softening point of 630° C., so that the glass layer 12 was formed on the primary surface 11a of the ceramic sintered body 11. In addition, processing, such as blast processing, was performed on the surface of the glass layer 12 to be used as the interface 15 between the glass layer 12 and the metal wiring layer 13. In this step, by changing the blast conditions, the surface characteristics of the glass layer 12 were changed.

Next, a metal paste to be formed into the metal wiring layer 13 was formed. First, a metal powder formed of copper was prepared by mixing 70 percent by mass of a first metal powder having an average particle diameter of 2.8 μm and 30 percent by mass of a second metal powder having an average particle diameter of 1.1 μm. Subsequently, 82.5 percent by mass of the metal powder and 17.5 percent by mass of an organic vehicle (3.5 percent by mass of an acrylic resin as the organic binder and 14 percent by mass of terpineol as the organic solvent) were blended together, so that the metal paste was formed.

In addition, by the use of the metal paste thus obtained, screen printing was performed on the surface of the glass layer 12 formed on the primary surface 11a of the ceramic sintered body 11, followed by performing drying, degreasing, and firing, so that the metal wiring layer 13 was formed. In this case, the metal wiring layer 13 was formed to have a thickness of 20 μm. In particular, the drying was performed at 100° C. in the air, and the firing was performed at a firing temperature of 950° C. for a firing time of 0.8 hours in a nitrogen atmosphere in which the oxygen concentration was controlled to 5 ppm, so that circuit boards of Sample Nos. 1 to 9 were obtained.

Subsequently, by the use of the samples thus obtained, the ceramic sintered body 11 was cut in a thickness direction thereof (perpendicular to the primary surface), and the cross section polished by a cross section polisher (CP) was used as a measuring surface and was observed at a magnification of 3,000 times using a SEM. In this case, the observation region was 43 μm in width and 28 μm in length. In addition, based on the image in this observation region, analysis was performed using an image analysis software (ImageJ), so that the length of the interface 15 between the glass layer 12 and the metal wiring layer 13 in this image was obtained. Next, the length of the interface 15 thus obtained was divided by the length (43 μm) of the length 12a in this image, so that the ratio in this image was calculated. In addition, for each sample, the work described above was performed at 5 positions in total by changing the observation region, and the average value obtained therefrom is shown in Table 1 as the length of the interface 15.

Figure 2:
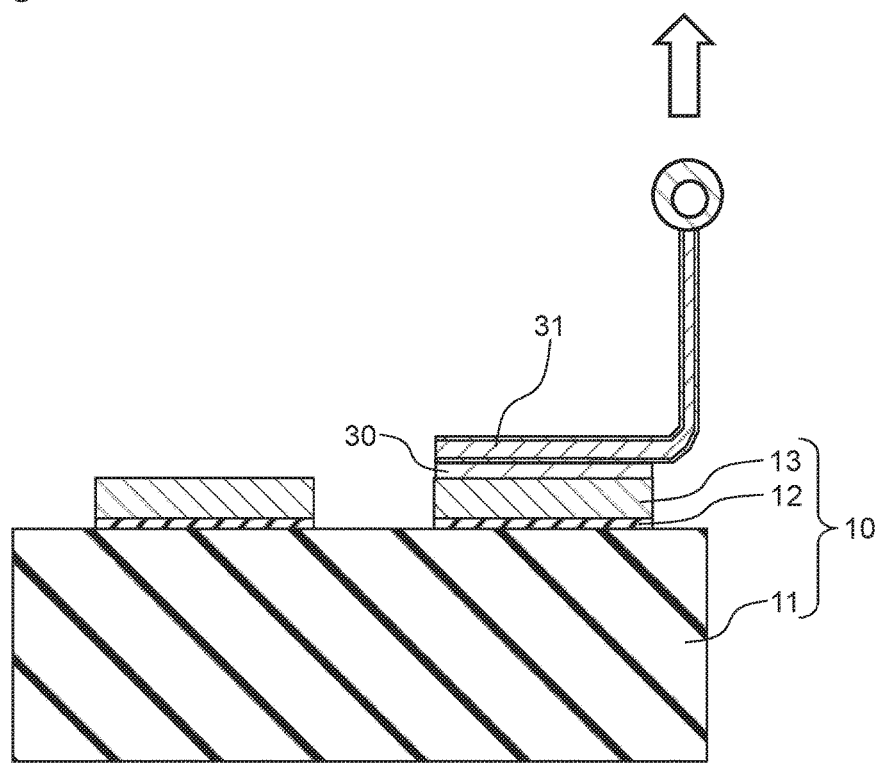
FIG. 2 is a schematic cross-sectional view showing a method for measuring an adhesion strength.

Next, a method for measuring the adhesion strength will be described. FIG. 2 is a cross-sectional view illustrating the method for measuring the adhesion strength, and this adhesion strength is a strength obtained in such a way that a plating conductive wire 31 bonded to the metal wiring layer 13 with a solder 30 provided therebetween is pulled up, and a strength at which the metal wiring layer 13 is peeled away from the glass layer 12 or the ceramic sintered body 11 is measured.

First, for the preparation of measuring the adhesion strength, the metal wiring layer 13 of each sample was etched so as to have a size of 2×2 mm². Subsequently, by the use of a flux (XA-100, manufactured by Tamura Kaken Corp.) and the solder 30 containing 2 percent by mass of Ag with respect to the total of a Sn—Pb (6:4) system, a plating conductive wire (Sn plating on a copper wire) 31 having a thickness of 0.6 mm was bonded (solder-bonded) to the surface of this metal wiring layer 13.

Next, as a test apparatus, by the use of a die shearing tester (model No. 520D) manufactured by ANZA TECH, the plating conductive wire 31 was pulled up at a rate of 7.62 mm/min, and the strength at which the metal wiring layer 13 was peeled away from the glass layer 12 or the ceramic sintered body 11 was measured. In addition, 10 test pieces of each sample was used for measurement, and the average value obtained from the data of those 10 test pieces is shown in Table 1 as the adhesion strength.

In addition, as the evaluation of the thermal reliability, a heat cycle test was performed. In this heat cycle test, 13 test pieces were prepared for each sample, and by the use of a thermal shock testing apparatus, a plurality of cycles were repeatedly performed in each of which after an environmental temperature of each test piece was decreased from room temperature (25° C.) to −45° C. and then maintained for 15 minutes, the temperature was increased to 125° C. and then maintained for 15 minutes, and the temperature was again decreased to room temperature. During the heat cycle test, one test piece of each sample was taken out of the apparatus every 50 cycles between 1,300 to 1,900 cycles and was inspected by observation. The number of cycles at which the peeling was confirmed is shown in Table 1. The confirmation of the peeling was performed by observation at a magnification of 1,000 times using a SEM.

TABLE 1

| Sample No. | Ratio of Length of Interface 15 to Length 12a | Adhesion Strength (N/2 × 2 mm$^2$) | Number of Cycles (Cycles) |
| --- | --- | --- | --- |
| 1 | 1.20 | 8 | 1300 |
| 2 | 1.25 | 20 | 1500 |
| 3 | 1.40 | 25 | 1600 |
| 4 | 1.45 | 33 | 1700 |
| 5 | 1.53 | 50 | 1800 |
| 6 | 1.62 | 44 | 1750 |
| 7 | 1.70 | 33 | 1700 |
| 8 | 1.80 | 30 | 1650 |
| 9 | 1.91 | 15 | 1400 |

As shown in Table 1, in Sample Nos. 1 and 9 in each of which the ratio of the length of the interface 15 between the glass layer 12 and the metal wiring layer 13 to the length 12a of the glass layer 12 was less than 1.25 or more than 1.80, the adhesion strength was low, and the number of cycles was 1,400 or less, so that the thermal reliability was low. In contrast, in Sample Nos. 2 to 8 in each of which the ratio of the length of the interface 15 between the glass layer 12 and the metal wiring layer 13 to the length 12a of the glass layer 12 was 1.25 to 1.80, the adhesion strength was high, such as 20 N/2×2 mm$^2$ or more, and the number of cycles was 1,500 or more, so that the thermal reliability was high. In particular, in Sample Nos. 4 to 7 in each of which the ratio of the length of the interface 15 between the glass layer 12 and the metal wiring layer 13 to the length 12a of the glass layer 12 was 1.45 to 1.70, the adhesion strength was higher, such as 33 N/2×2 mm$^2$ or more, and the number of cycles was 1,700 or more, so that the thermal reliability was higher.

From the results described above, it was found that since the metal wiring layer 13 was provided on at least one primary surface 11a of the ceramic sintered body 11 with the glass layer 12 interposed therebetween, and when the cross section of the circuit board 10 in a direction perpendicular to the primary surface 11 of the ceramic sintered body 11 was viewed, since the ratio of the length of the interface 15 between the glass layer 12 and the metal wiring layer 13 to the length 12a of the glass layer 12 in a direction along the primary surface 11a was 1.25 to 1.80, good heat dissipation characteristics were not only obtained, but also peeling of the metal wiring layer 13 from the ceramic sintered body 11 due to the operation of the electronic component 21 and/or cooling/heating cycles performed by repeated on-off operations thereof could be suppressed. Hence, it was also found that a highly reliable circuit board 10 which could be used for a long period of time could be obtained.

EXAMPLE 2

Next, samples having different presence rates of the crystal particles 14 in the glass layer 12 were formed, and the adhesion strength and the thermal reliability of each sample were confirmed.

As the ceramic sintered body 11, the same as that used in Example 1 was prepared. Next, as the metal paste, the following paste was prepared. First, a metal powder formed of copper was prepared by mixing 70 percent by mass of a first metal powder having an average particle diameter 2.8 μm and 30 percent by mass of a second metal powder having an average particle diameter of 1.1 μm. In addition, as the inorganic powder, a zinc aluminate powder having an average particle diameter of 1.0 μm was prepared in such a way that after an aluminum oxide powder and a zinc oxide powder were mixed at a molar ratio of 1:1, a calcination treatment was performed at a calcination temperature of 900° C. for a calcination time of 1 hour, followed by performing pulverization. Furthermore, by the use of a magnesium oxide powder, a manganese oxide powder, and an iron oxide powder, magnesium aluminate, manganese aluminate, and iron aluminate were also prepared by the method similar to that described above.

In addition, an $R_2O$—$B_2O_3$—$SiO_2$-based glass powder having an average particle diameter of 1.3 μm and a softening point of 630° C. was prepared. Subsequently, 82 percent by mass of the metal powder, 3 percent by mass of the glass powder, 15 percent by mass of an organic vehicle (3 percent by mass of an acrylic resin as the organic binder and 12 percent by mass of terpineol as the organic solvent), and the inorganic powder in the mass shown in Table 2 with respect to 100 parts by mass of the glass powder were blended together, so that the metal paste was formed.

Next, by the use of the metal paste thus obtained, screen printing was performed on the primary surface 11a of the ceramic sintered body 11, followed by performing drying and firing, so that the glass layer 12 and the metal wiring layer 13 were formed on the primary surface 11a of the ceramic sintered body 11. In this case, the metal wiring layer 13 was formed to have a thickness of 20 μm. In particular, the drying was performed at 100° C. in the air, and the firing was performed at a firing temperature of 930° C. for a firing time of 0.8 hours in a nitrogen atmosphere in which the oxygen concentration was controlled to 5 ppm, so that circuit boards of Sample Nos. 10 to 20 were obtained.

Next, the cross section of each sample prepared by a method similar to that of Example 1 was used as the measuring surface and was observed at a magnification of 3,000 times using a SEM. The observation region in this case was also 43 μm in width and 28 μm in length. Subsequently, based on the image in this observation region, the number of the crystal particles 14 having a circle equivalent diameter of 0.4 to 2.0 μm was calculated using an image analysis software (ImageJ) and was then divided by the length (43 μm in this region) of the length 12a, so that the presence rate of the crystal particles 14 was obtained. For the calculation of this presence rate, the measurement was performed at 5 positions in total by changing the observation region, and the average value obtained therefrom is shown in Table 2 as the presence rate of the crystal particles 14 in each sample. In addition, by the confirmation using an EDS attached to a SEM, the crystal particles 14 of each sample were identified. In this identification, for example, when Al, O, and Zn were detected, it was regarded that zinc aluminate was identified.

In addition, by a method similar to that of Example 1, the adhesion strength and the number of cycles were measured, and the results are shown in Table 2.

TABLE 2

| Sample No. | Crystal Particles 14 Present in Glass Layer 12 | Inorganic Powder (Parts by Mass) | Presence Rate (Pieces/ μm) | Adhesion Strength (N/2 × 2 mm$^2$) | Number of Cycles (Cycles) |
|---|---|---|---|---|---|
| 10 | Zinc Aluminate | 10 | 0.42 | 20 | 1500 |
| 11 | Zinc Aluminate | 15 | 0.50 | 35 | 1700 |
| 12 | Zinc Aluminate | 20 | 0.62 | 40 | 1750 |
| 13 | Zinc Aluminate | 25 | 0.70 | 50 | 1800 |
| 14 | Zinc Aluminate | 30 | 0.75 | 60 | 1900 |
| 15 | Zinc Aluminate | 33 | 0.83 | 50 | 1800 |
| 16 | Zinc Aluminate | 36 | 0.90 | 41 | 1750 |
| 17 | Zinc Aluminate | 40 | 0.96 | 25 | 1600 |
| 18 | Magnesium Aluminate | 20 | 0.62 | 38 | 1700 |
| 19 | Manganese Aluminate | 20 | 0.62 | 38 | 1700 |
| 20 | Iron Aluminate | 20 | 0.62 | 38 | 1700 |

As shown in Table 2, in Sample Nos. 11 to 16 and 18 to 20 in which the presence rate of the crystal particles 14 having a circle equivalent diameter of 0.4 to 2.0 μm in the glass layer 12 was 0.50 to 0.90 pieces/μm, the adhesion strength was high, such as 35 N/2×2 mm$^2$ or more, and the number of cycles was 1,700 or more, so that the thermal reliability was high. In particular, in Sample Nos. 13 to 15 in which the presence rate of the crystal particles 14 in the glass layer 12 was 0.70 to 0.83, the adhesion strength was 50 N/2×2 mm$^2$ or more, and the number of cycles was 1,800 or more, so that the adhesion strength was higher, and the thermal reliability was also higher.

In addition, according to the results of Sample Nos. 13, 18, 19, and 20 in which the addition amount of the inorganic powder was constant, and the component of the crystal particles 14 was different from each other, it was found that zinc aluminate was preferably used as the crystal particles 14.

EXAMPLE 3

Next, samples were formed in each of which the metal paste was formed with or without the addition of an aluminum oxide powder, and the plating adhesion of each sample was confirmed.

Except that the metal paste was formed with or without the addition of aluminum oxide, and that the aluminum oxide sintered body was formed to have a size of 80 mm by 80 mm and a thickness of 0.7 mm, one sample was prepared by a method similar to that of Sample No. 13 of Example 2.

Next, as for Sample Nos. 22 and 23, the metal pastes were each formed with the addition of 0.3 parts by mass of an aluminum oxide powder having an average particle diameter shown in Table 3 with respect to 100 parts by mass of the metal powder.

Subsequently, by the use of the metal paste thus obtained, screen printing was performed on the primary surface 11a of the ceramic sintered body 11 so that 225 (15×15) metal wiring layers 13 each having an area of 2×2 mm$^2$ were formed after firing, and drying and firing were then performed, so that metal wiring layers 13 each having a thickness of 20 μm were formed. The subsequent drying and firing conditions were performed in a manner similar to that of Example 2.

Next, a plating treatment was performed on the metal wiring layer 13 using a Ni plating solution. In particular, by the use of a new Ni plating solution containing a carboxylate salt, a phosphate salt, and nickel sulfate at a known ratio, Ni plating was performed at a test temperature of 84° C. to have a thickness of approximately 4 μm, so that circuit boards of Sample Nos. 21 to 23 were obtained.

First, by the use of an EDS attached to a SEM for the cross section of the glass layer 12, the constituent elements of the glass layer 12 were confirmed. Next, the cross section of the metal wiring layer 13 was observed at a magnification of 10,000 times using a SEM, and by a mapping obtained using the attached EDS, it was confirmed whether the same element as the constituent element of the glass layer 12 which was confirmed in advance was present or not at the presence position (the position at which a mapping of aluminum and that of oxygen were overlapped with each other) of alumina particles. That is, in this case, it was confirmed whether silicon was present or not. The presence or absence of the glass component in the presence region of alumina particles is shown in Table 3.

In addition, by the use of a metal microscope, the plating layers formed on the 225 metal wiring layers 13 of each sample were observed, and the number of metal wiring layers 13 each having a portion to which plating was not adhered was counted, and the results are shown in Table 3.

TABLE 3

| Sample No. | Average Particle Diameter of Aluminum Oxide Powder (μm) | Presence of Glass *1 | Number of Layers without Plating Adhesion (Layers) |
|---|---|---|---|
| 21 | — | none | 11 |
| 22 | 1.3 | none | 5 |
| 23 | 0.4 | yes | 0 |

*1: The presence of at least one component which is the same as one of the constituent components of the glass layer in the presence region of alumina particles.

As shown in Table 3, it was found that since the alumina particles were present in the metal wiring layer 13, and at least one component which is the same as one of the constituent components of the glass layer 12 was present in the presence region of alumina particles, degradation in plating adhesion could be suppressed. In addition, it was also found that as for the average particle diameter of the aluminum oxide powder to be added, a powder having an average particle diameter smaller than that of the glass powder was preferably used.

EXAMPLE 4

Next, samples were formed in each of which the glass layer 12 was provided with or without zirconia particles, and the adhesion strengths before and after an acid treatment of each sample were confirmed. In Sample No. 25 in which zirconia particles were present in the glass layer 12, 5 parts by mass of a zirconium oxide powder was added to 100 parts by mass of the glass powder, and except that described above, a manufacturing method was performed in a manner similar to that of Sample No. 13 of Example 2. Sample No.

24 in which no zirconium oxide powder was added was the same as Sample No. 13. In addition, two test pieces were formed for each Sample.

Subsequently, by a method similar to that of Example 1, the adhesion strength was measured. In addition, the remaining test piece of each sample was immersed in an aqueous sulfuric acid solution having a concentration of 10 percent by volume for 10 minutes for the acid treatment, and the adhesion strength was then measured by a method similar to that of Example 1. The results are shown in Table 4. As for Sample No. 25, the presence of zirconia particles in the glass layer 12 was confirmed by a SEM.

TABLE 4

| Sample No. | Presence of Zirconia Particles | Adhesion Strength before Acid Treatment (N/2 × 2 mm$^2$) | Adhesion Strength after Acid Treatment (N/2 × 2 mm$^2$) |
|---|---|---|---|
| 24 | none | 50 | 35 |
| 25 | yes | 50 | 46 |

As shown in Table 4, it was found that since the zirconia particles were present in the glass layer 12, a high adhesion strength could be maintained.

EXAMPLE 5

Samples were formed in each of which the surface of the aluminum oxide sintered body was provided with or without zirconia particles, and the reflectance of each sample was confirmed. As a method for forming a sample in which the surface of the aluminum oxide sintered body was provided with or without zirconia particles, when the aluminum oxide sintered body was formed, 8 parts by mass of a zirconium oxide powder was added to 100 parts by mass of an aluminum oxide powder. Sample No. 26 was the same as Sample No. 13.

Subsequently, the reflectance was measured by a spectrophotometer using a 50-W halogen lamp and a deuterium lamp without a mask under the conditions in which the wavelength range was set to 500 nm, the measurement range was set to 7×9 mm, and the slit width was set to 20 nm. The results are shown in Table 5.

TABLE 5

| Sample No. | Addition Amount of Zirconia Particles (Parts by Mass) | Presence of Zirconia Particles | Reflectance |
|---|---|---|---|
| 26 | 0 | none | 89% |
| 27 | 9 | yes | 92% |

As shown in Table 5, it was found that since zirconia particles were present on the surface of the aluminum oxide sintered body, the reflectance could be improved.

REFERENCE SIGNS LIST 10 circuit board
11 ceramic sintered body
11a primary surface
12 glass layer
12a length
13 metal wiring layer
14 crystal particle
15 interface
20 electronic apparatus
21 electronic component
22 electrode pad
23 bonding wire

The invention claimed is:

1. A circuit board comprising:
   a ceramic sintered body comprising a primary surface;
   a glass layer on the primary surface, containing crystal particles having a spinel structure; and
   a wiring layer on the glass layer,
   wherein a ratio of an interface length between the glass layer and the wiring layer to a length of the glass layer in a direction along the primary surface in a cross section of the circuit board perpendicular to the primary surface is 1.25 to 1.80, and
   wherein the crystal particles have a circle equivalent diameter of 0.4 to 2.0 μm, and the presence rate of the crystal particles with respect to the length of the glass layer is 0.50 to 0.90 pieces/μm.

2. The circuit board according to claim 1, wherein the wiring layer further comprises:
   alumina particles; and
   a component that
      is contained in the glass layer, and
      is located in a presence region of the alumina particles.

3. The circuit board according to claim 1, wherein the glass layer further comprises zirconia particles.

4. The circuit board according to claim 1, wherein the ceramic sintered body comprises:
   an aluminum oxide sintered body, and
   zirconia particles at a surface of the aluminum oxide sintered body.

5. An electronic apparatus comprising:
   a circuit board comprising
      a ceramic sintered body comprising a primary surface,
      a glass layer on the primary surface, containing crystal particles having a spinel structure, and
      a wiring layer disposed on the glass layer,
      wherein the crystal particles have a circle equivalent diameter of 0.4 to 2.0 μm, and the presence rate of the crystal particles with respect to the length of the glass layer is 0.50 to 0.90 pieces/μm, and a ratio of an interface length between the glass layer and the wiring layer to a length of the glass layer in a direction along the primary surface in a cross section of the circuit board perpendicular to the primary surface is 1.25 to 1.80; and an electronic component disposed on the circuit board.

* * * * *